US012463014B2

(12) United States Patent
Arita et al.

(10) Patent No.: US 12,463,014 B2
(45) Date of Patent: Nov. 4, 2025

(54) ACTIVE GAS GENERATOR

(71) Applicant: TOSHIBA MITSUBISHI-ELECTRIC INDUSTRIAL SYSTEMS CORPORATION, Tokyo (JP)

(72) Inventors: Ren Arita, Tokyo (JP); Kensuke Watanabe, Tokyo (JP)

(73) Assignee: TMEIC CORPORATION, Tokyo (JP)

(*) Notice: Subject to any disclaimer, the term of this patent is extended or adjusted under 35 U.S.C. 154(b) by 783 days.

(21) Appl. No.: 17/792,732

(22) PCT Filed: Dec. 24, 2020

(86) PCT No.: PCT/JP2020/048429
§ 371 (c)(1),
(2) Date: Jul. 14, 2022

(87) PCT Pub. No.: WO2022/137423
PCT Pub. Date: Jun. 30, 2022

(65) Prior Publication Data
US 2023/0025809 A1 Jan. 26, 2023

(51) Int. Cl.
*H01J 37/32* (2006.01)

(52) U.S. Cl.
CPC .... *H01J 37/32348* (2013.01); *H01J 37/3244* (2013.01); *H01J 37/32532* (2013.01)

(58) Field of Classification Search
CPC .................................................... C23C 16/455
See application file for complete search history.

(56) References Cited

U.S. PATENT DOCUMENTS

2015/0170909 A1 6/2015 Sato
2020/0343078 A1 10/2020 Watanabe et al.

FOREIGN PATENT DOCUMENTS

JP 2010073910 A * 4/2010
KR 101503906 B1 * 3/2015 ........ H01J 37/32348
KR 2015-0077254 A 7/2015
KR 2020-0096607 A 8/2020
WO 2019/138456 A1 7/2019

OTHER PUBLICATIONS

English translation of JP-2010073910-A (Year: 2010).*
English translation of KR-101503906-B1 (Year: 2015).*
Office Action issued on Oct. 17, 2024, in corresponding Korean patent Application No. 10-2022-7023365, 13 pages.
International Search Report and Written Opinion mailed on Mar. 9, 2021, received for PCT Application PCT/JP2020/048429, filed on Dec. 24, 2020, 8 pages including English Translation.

* cited by examiner

*Primary Examiner* — James Lin
*Assistant Examiner* — Nathanael Jason Downes
(74) *Attorney, Agent, or Firm* — XSENSUS LLP

(57) ABSTRACT

A housing in an active gas generator according to the present disclosure includes a peripheral stepped region formed along an outer periphery of a central bottom region, the peripheral stepped region being higher in formed height than the central bottom region. A high-voltage-electrode dielectric film on the peripheral stepped region forms a gas separation structure for separating a gas stream into a feeding space and an active gas generating space including a discharge space. A vacuum pump disposed outside the housing sets the feeding space under vacuum.

6 Claims, 7 Drawing Sheets

100
19
15
78
8
79
1
3
2
13
R4
5
14
4
16
16c
16b
16a
18
7a
73
61
30
53
23
49
7
R7
60
70
6
X
Y
Z

ACTIVE GAS GENERATOR

CROSS-REFERENCE TO RELATED APPLICATION

The present application is based on PCT filing PCT/JP2020/048429, filed Dec. 24, 2020, the entire contents of which are incorporated herein by reference.

TECHNICAL FIELD

The present disclosure relates to an active gas generator that generates active gas through a parallel-plate dielectric barrier discharge.

BACKGROUND ART

Examples of an active gas generator that separates a gas stream into an active gas generating space including a discharge space and a feeding space (an AC voltage application space) include an active gas generator disclosed in Patent Document 1.

This active gas generator separates a gas stream into an active gas generating space and a feeding space, using the first and second auxiliary components.

PRIOR ART DOCUMENT

Patent Document

Patent Document 1: WO2019/138456

SUMMARY

Problem to be Solved by the Invention

Conventional active gas generators have an advantage of not bringing, into an active gas generating space, a contaminant caused by an electrical breakdown in a feeding space, by separating a gas stream into the active gas generating space and the feeding space. The contaminant caused by the electrical breakdown herein means that, for example, an electrical breakdown occurring on a metal surface of, for example, a metal housing forming a feeding space vaporizes or ionize the metal, and consequently causes a semiconductor to be contaminated. Hereinafter, a structure for separating a gas stream into an active gas generating space including a discharge space and a feeding space may be simply referred to as a "gas separation structure".

As such, the conventional active gas generators with the gas separation structure can prevent the active gas generating space from being subject to the contaminant caused by the electrical breakdown in the feeding space. However, the electrical breakdown in the feeding space consumes a part of a discharge application voltage (discharge energy) fed to generate active gas.

Specifically, as the electrical breakdown in the feeding space unnecessarily consumes the discharge application voltage (power), the discharge voltage (power) to be applied to the discharge space decreases. Thus, the energy efficiency for generating the active gas is poor.

For example, when the discharge application power of 100 W is applied to an active gas generator and the electrical breakdown in the feeding space unnecessarily consumes the power of 20 W, the discharge power to be applied to the discharge space for generating the active gas decreases to 80 W.

Thus, the conventional active gas generators have a problem of decrease in the amount of active gas to be generated, because the electrical breakdown in the feeding space worsens energy efficiency for generating the active gas.

The first conceivable measure for solving the problem is to increase the pressure in the feeding space, for example, to ten times atmospheric pressure as a method for preventing the electrical breakdown in the feeding space. However, the first measure increases a differential pressure (pressure difference) between the feeding space and the active gas generating space. The force exerted on a component (e.g., a high-voltage-electrode dielectric film) subject to the differential pressure increases, and may damage the component.

In the following DESCRIPTION, the component subject to the differential pressure may be simply referred to as a "differential pressure receiving component", and the force exerted on the differential pressure receiving component by the differential pressure may be simply referred to as a "differential-pressure applied force".

The second conceivable measure for preventing the high-voltage-electrode dielectric film that is a differential pressure receiving component from being damaged is to thicken the high-voltage-electrode dielectric film.

As such, enhancement of the insulating properties of the feeding space and increase in the amount of active gas to be generated require taking both of the first and second measures.

A high voltage feeder is also a differential pressure receiving component, and is made of a metal more rigid than that of a high-voltage-electrode dielectric film. The size of the high voltage feeder made of the metal can be freely changed. Thus, the high voltage feeder is never damaged by the differential-pressure applied force.

However, taking both of the first and second measures is not preferable. The reason will be described below.

Since the high-voltage-electrode dielectric film that is one of differential pressure receiving components is also a component for allowing an electric field to pass through the active gas generating space in which active gas is generated, thickening the high-voltage-electrode dielectric film increases a differential pressure receiving voltage that is a voltage between the upper surface and the lower surface of the high-voltage-electrode dielectric film. Specifically, thickening the high-voltage-electrode dielectric film increases a percentage of the differential pressure receiving voltage in the discharge application voltage.

As such, thickening an electrode dielectric film that is a differential pressure receiving component in the conventional active gas generators reduces the discharge voltage to be applied to the discharge space as the differential pressure receiving voltage increases. Decrease in the discharge voltage reduces the discharge power.

Consequently, the conventional active gas generators have a problem of decrease in the amount of active gas to be generated, because taking both of the first and second measures under a constant discharge application voltage reduces the discharge power as the high-voltage-electrode dielectric film is thicker.

On the other hand, increase in the discharge application voltage for increasing the amount of active gas to be generated needs to increase the pressure in the feeding space to enhance the insulating properties of the feeding space. However, increasing the pressure in the feeding space further increases the differential-pressure applied force exerted on the electrode dielectric film. Accordingly, the electrode dielectric film needs to be thickened.

As described above, thickening the electrode dielectric film causes decrease in the amount of active gas to be generated. Thus, increasing the discharge application voltage and thickening the electrode dielectric film in the conventional active gas generators produce contradictory effects on the amount of active gas to be generated (discharge power).

Specifically, taking the second measure of thickening the electrode dielectric film produces a disadvantage of decrease in the amount of active gas to be generated. Thus, it is extremely difficult to reduce the decrease in the amount of active gas to be generated, using the combination of the first and second measures.

As such, the conventional active gas generators have a problem of difficulty in enhancing the insulating properties of the feeding space without reducing the amount of active gas to be generated.

An object of the present disclosure is to solve such problems and provide an active gas generator with enhanced insulating properties in the feeding space, without reducing the amount of active gas to be generated.

Means to Solve the Problem

An active gas generator according to the present disclosure supplies a material gas to a discharge space where a dielectric barrier discharge occurs, to activate the material gas and generate active gas, and includes: a first electrode dielectric film; a second electrode dielectric film formed below the first electrode dielectric film; a first feeder disposed on an upper surface of the first electrode dielectric film, the first feeder having conductivity; and a second feeder disposed on a lower surface of the second electrode dielectric film, wherein an AC voltage is applied to the first feeder, the second feeder is set to ground potential, and a dielectric space in which the first electrode dielectric film faces the second electrode dielectric film includes the discharge space, the second electrode dielectric film includes a gas outlet for ejecting the active gas downward, the active gas generator further includes a housing having conductivity and accommodating the first and second electrode dielectric films and the first and second feeders, the housing including a feeding space above the first feeder, the housing including: a material gas inlet receiving the material gas from outside; a gas relay region for supplying the material gas to the discharge space; and a housing gas outlet for ejecting the active gas from the gas outlet downward, a space from the material gas inlet to the housing gas outlet through the gas relay region and the discharge space is defined as an active gas generating space, the housing and the first electrode dielectric film form a gas separation structure for separating a gas stream into the active gas generating space and the feeding space, and the active gas generator further includes a vacuum pump disposed outside the housing and setting the feeding space under vacuum.

Effects of the Invention

The active gas generator according to the present disclosure has a gas separation structure for separating a gas stream into the active gas generating space and the feeding space.

The active gas generator according to the present disclosure sets the feeding space under vacuum using the vacuum pump, so that the feeding space exhibits relatively high insulating properties.

Here, the pressure difference between the feeding space and the discharge space is as high as a pressure in the discharge space. Since reducing the pressure in the discharge space can keep lower the differential-pressure applied force exerted on the first electrode dielectric film, the first electrode dielectric film need not be thicker more than necessary.

Consequently, the active gas generator according to the present disclosure can produce an advantage of enhancing the insulating properties in the feeding space without reducing the amount of active gas to be generated.

The object, features, aspects and advantages of the present disclosure will become more apparent from the following detailed description and the accompanying drawings.

DESCRIPTION OF EMBODIMENTS

Principle of Present Disclosure

In an active gas generator with a gas separation structure of separating a feeding space and an active gas generating space, the principle of the present disclosure is to enhance the insulating properties in the feeding space and prevent an electrical breakdown in the feeding space, by setting the feeding space under vacuum.

The insulating properties (dielectric strength) in the feeding space under vacuum are superior to those when the pressure in the feeding space is set at near atmospheric pressure. The dielectric strength in the feeding space indicates a limit value of an electric field that can be applied to the feeding space without any electrical breakdown in the feeding space.

In contrast, when one desires to obtain a dielectric strength equivalent to that under vacuum by setting the feeding space in non-vacuum conditions, the ambient pressure in the feeding space needs to be increased. For example, it is necessary to set the pressure in the feeding space to approximately ten times atmospheric pressure.

When the pressure in the feeding space is set to approximately ten times atmospheric pressure, a differential pressure (pressure difference) between the feeding space and a discharge space increases. As a result, a relatively large differential-pressure applied force is exerted on a high-voltage-electrode dielectric film that is a differential pressure receiving component.

When the feeding space is set under vacuum, the differential-pressure applied force to be exerted on an electrode dielectric film is equivalent to the pressure in the discharge space.

In the DESCRIPTION, the active gas generating space includes a space until material gas reaches the discharge space, the discharge space, and an internal space until active gas is finally ejected from the discharge space to the outside.

Thus, setting the feeding space under vacuum under a discharge pressure condition where the pressure of the active gas generating space including the discharge space is set at near atmospheric pressure or lower than atmospheric pressure can reduce the differential-pressure applied force exerted on the electrode dielectric film to a relatively small force.

Since allowing the electrode dielectric film to be thinned in the active gas generator can maintain a high percentage of the discharge voltage in the discharge application voltage, the amount of active gas to be generated hardly decreases.

Furthermore, a high voltage feeder with a cooling function can cool the high-voltage-electrode dielectric film, and remove heat generated during discharge from the electrode dielectric film. Thus, damage caused by a thermal expansion in the electrode dielectric film can be prevented.

The active gas generators obtained based on the principle of the present disclosure are active gas generators according to Embodiment 1 and 2.

Embodiment 1

(Whole Structure)

Figure 1:
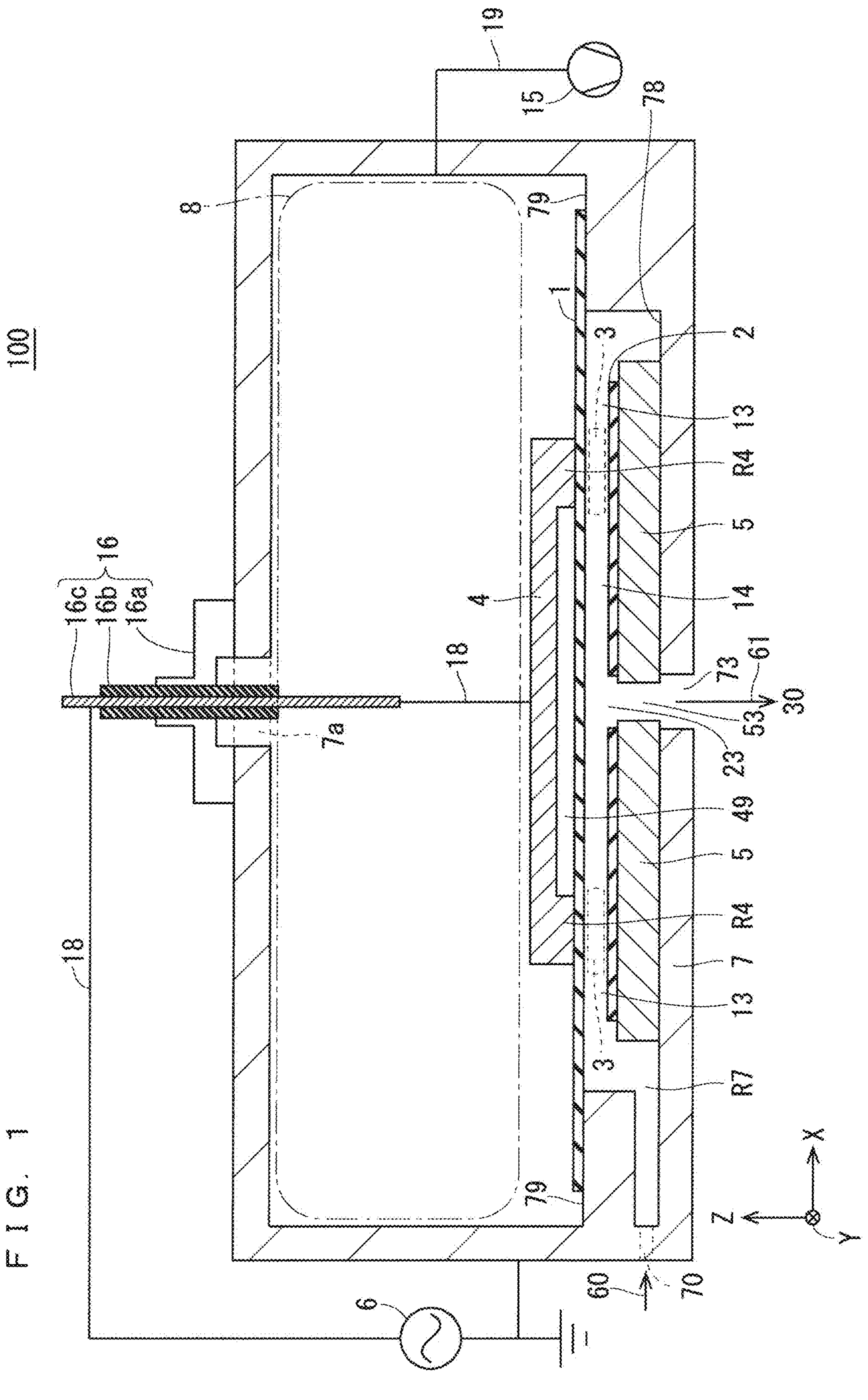
FIG. 1 illustrates a whole structure of an active gas generator according to Embodiment 1.

FIG. 1 illustrates a whole structure of an active gas generator 100 according to Embodiment 1 of the present disclosure. FIG. 1 illustrates an XYZ rectangular coordinate system. The active gas generator 100 according to Embodiment 1 supplies material gas 60 to a discharge space 3 where a dielectric barrier discharge occurs, to activate the material gas 60 and generate active gas 61. Conceivable examples of the material gas 60 include nitrogen gas, and conceivable examples of the active gas 61 include nitrogen radical.

The active gas generator 100 according to Embodiment 1 includes, as main constituent elements, a high-voltage-electrode dielectric film 1, a ground-electrode dielectric film 2, a high voltage feeder 4, a ground feeder 5, a high-voltage AC power supply 6, a housing 7, a vacuum pump 15, and a current lead terminal 16.

A high voltage application electrode part includes the high-voltage-electrode dielectric film 1 that is a first electrode dielectric film, and the high voltage feeder 4 that is a first feeder. A ground potential electrode part includes the ground-electrode dielectric film 2 that is a second electrode dielectric film, and the ground feeder 5 that is a second feeder. The ground-electrode dielectric film 2 is formed below the high-voltage-electrode dielectric film 1.

The housing 7 is made of a metal having conductivity, and accommodates the high-voltage-electrode dielectric film 1, the ground-electrode dielectric film 2, the high voltage feeder 4, and the ground feeder 5. The housing 7 includes a feeding space 8 above the high voltage feeder 4.

The housing 7 includes a central bottom region 78, and a peripheral stepped region 79 formed along an outer periphery of the central bottom region 78. The upper surface of the peripheral stepped region 79 is set higher than that of the central bottom region 78 in a height direction (+Z direction).

The ground feeder 5 having conductivity is disposed on the central bottom region 78 of the housing 7. The ground-electrode dielectric film 2 is formed on the ground feeder 5. In other words, the ground feeder 5 is disposed on the lower surface of the ground-electrode dielectric film 2. Accordingly, the ground potential electrode part is placed on the central bottom region 78 so that the ground feeder 5 is in contact with the central bottom region 78.

Thus, a formed height of the upper surface of the ground-electrode dielectric film 2 is determined by a formed height of the central bottom region 78 and a thickness of the ground potential electrode part (a thickness of the ground feeder 5+a thickness of the ground-electrode dielectric film 2).

Then, the housing 7 is set to ground potential. Thus, the ground feeder 5 is set to ground potential through the central bottom region 78 of the housing 7.

The high-voltage-electrode dielectric film 1 is formed on the peripheral stepped region 79. Specifically, an end region of the high-voltage-electrode dielectric film 1 is formed on the peripheral stepped region 79. Thus, a space region is formed below a dielectric central region except for the end region of the high-voltage-electrode dielectric film 1.

The high voltage feeder 4 is disposed on the upper surface of the high-voltage-electrode dielectric film 1. Specifically, a lower protruding region R4 of the high voltage feeder 4 is disposed in contact with the upper surface of the high-voltage-electrode dielectric film 1. The lower protruding region R4 is annularly formed along an outer peripheral region of the high voltage feeder 4 in a plan view of an XY plane. A lower space 49 is formed below a feeder central region except for the lower protruding region R4. The feeder central region is not in contact with the upper surface of the high-voltage-electrode dielectric film 1.

Thus, a formed height of the lower surface of the high-voltage-electrode dielectric film 1 is determined by a formed height of the peripheral stepped region 79.

The high-voltage AC power supply 6 applies an AC voltage between the high voltage feeder 4 and the ground feeder 5. Specifically, the high-voltage AC power supply 6 applies the AC voltage to the high voltage feeder 4, and the ground feeder 5 is set to ground potential through the housing 7.

The current lead terminal 16 is disposed in an opening 7*a* and around its periphery on the upper surface of the housing 7. The current lead terminal 16 includes, as main constituent elements, a terminal block 16*a*, an insulated pipe 16*b*, and an electrode 16*c*. The terminal block 16*a* is formed across the opening 7*a* on the housing 7. The insulated pipe 16*b* is attached to the terminal block 16*a* so that its upper portion extends outside the housing 7 and its lower portion reaches the feeding space 8 in the housing 7. The electrode 16*c* is disposed from the outside of the housing 7 to an internal portion of the feeding space 8 through a hollow portion of the insulated pipe 16*b*. The current lead terminal 16 completely blocks the opening 7*a* of the housing 7 from the outside.

The upper end of the electrode 16*c* is exposed to the outside of the housing 7, and the lower end of the electrode 16*c* is exposed within the feeding space 8. The high-voltage AC power supply 6 is electrically connected to the upper end of the electrode 16*c* of the current lead terminal 16 through an electrical wire 18. The lower end of the electrode 16*c* is electrically connected to the high voltage feeder 4 through the electrical wire 18.

Accordingly, the high-voltage AC power supply 6 applies the AC voltage to the high voltage feeder 4 through the electrode 16*c* of the current lead terminal 16. This AC voltage is used as the discharge application voltage. Specifically, the discharge application voltage is a potential difference between the high voltage feeder 4 and the ground feeder 5.

In Embodiment 1, the dielectric strength of the feeding space 8 indicates a limit value of an electric field that does not cause an electrical breakdown in the feeding space 8. The electric field means an electric field between the electrode 16*c* of the current lead terminal 16 and the housing 7.

The feeding space 8 is a space including the electrode 16*c* and the electrical wire 18 in the housing 7 above the high voltage feeder 4. The feeding space 8 is an internal space within the housing 7 for supplying the discharge application voltage from the high-voltage AC power supply 6 to the high voltage feeder 4 through the current lead terminal 16.

The active gas generator 100 further includes the vacuum pump 15 outside. The vacuum pump 15 is connected to the feeding space 8 through an air pipe 19 to discharge gas in the feeding space 8 to the outside. The vacuum pump 15 sets the feeding space 8 under vacuum so that the pressure in the feeding space 8 is less than 0.01 Pa. Conceivable examples of the vacuum pump 15 include a turbo-molecular pump.

A dielectric space in which the high-voltage-electrode dielectric film 1 faces the ground-electrode dielectric film 2 includes the discharge space 3 including a region where the lower protruding region R4 of the high voltage feeder 4 overlaps the ground feeder 5 in a plan view. This discharge space 3 is annularly formed in a plan view of the XY plane.

Furthermore, in the dielectric space between the high-voltage-electrode dielectric film 1 and the ground-electrode dielectric film 2, an outer peripheral region outside the discharge space 3 is an outer peripheral dielectric space 13, and a spatial central region inside the discharge space 3 is a central dielectric space 14.

The ground-electrode dielectric film 2 includes a gas outlet 23 for ejecting the active gas 61 to a processing space 30.

The ground feeder 5 includes, in a region corresponding to the gas outlet 23 (a feeder gas outlet) of the ground-electrode dielectric film 2, a gas outlet 53 wider than the gas outlet 23 and including the gas outlet 23 in a plan view of the XY plane.

A central portion of the central bottom region 78 of the housing 7 includes a gas outlet 73 (a housing gas outlet) in a region corresponding to the gas outlet 53 of the ground feeder 5 and the gas outlet 23 of the around-electrode dielectric film 2. The gas outlet 73 includes the gas outlet 23 in a plan view of the XY plane, and is wider than the gas outlet 23.

Thus, the active gas generator 100 can eject the active gas 61 obtained in the discharge space 3 from the gas outlet 23 of the ground-electrode dielectric film 2 to the processing space 30 below (a subsequent stage) through the gas outlet 53 of the ground feeder 5 and the gas outlet 73 of the housing 7.

In the active gas generator 100 according to Embodiment 1, the high voltage application electrode part (the high-voltage-electrode dielectric film 1+the high voltage feeder 4) is disposed not on the ground potential electrode part (the ground-electrode dielectric film 2+the ground feeder 5) through a spacer but on the peripheral stepped region 79 of the housing 7.

Specifically, the active gas generator 100 according to Embodiment 1 includes an attachment feature of independently providing the high voltage application electrode part and the ground potential electrode part.

The housing 7 includes a material gas inlet 70 on one side surface lower than the peripheral stepped region 79. The material gas 60 supplied from the outside flows from the material gas inlet 70 through a gas relay region R7 in the housing 7.

Thus, the material gas 60 flowing through the gas relay region R7 is supplied to the discharge space 3 through the outer peripheral dielectric space 13 near the outer periphery between the high-voltage-electrode dielectric film 1 and the ground-electrode dielectric film 2.

The high-voltage AC power supply 6 applies the discharge application voltage between the high voltage feeder 4 and the ground feeder 5 to cause a dielectric barrier discharge in the discharge space 3. Thus, passing of the material gas 60 through the discharge space generates the active gas 61.

The active gas 61 generated in the discharge space 3 is supplied to the processing space 30 outside through the central dielectric space 14 and the gas outlets 23, 53, and 73.

As such, the housing 7 includes the material gas inlet 70 receiving the material gas 60 from the outside, and the gas relay region R7 for relaying the material gas 60 to the discharge space 3.

Here, the space from the material gas inlet 70 to the gas outlet 73 of the housing 7 is defined as an "active gas generating space". Specifically, the active gas generating space is a space from the material gas inlet 70 to the gas outlet 73 that is the housing gas outlet, through the gas relay region R7, the outer peripheral dielectric space 13, the discharge space 3, the central dielectric space 14, and the gas outlets 23 and 53.

The high-voltage-electrode dielectric film 1 formed on the peripheral stepped region 79 completely separates the active gas generating space from the feeding space 8.

This active gas generator 100 according to Embodiment 1 separates a gas stream into the feeding space 8 and the active gas generating space including the discharge space 3, using a combined structure of the peripheral stepped region 79 of the housing 7 and the high-voltage-electrode dielectric film 1. This combined structure is the gas separation structure.

Since the active gas generator 100 according to Embodiment 1 has the gas separation structure, the material gas 60 flowing through the gas relay region R7 does not enter the feeding space 8. Conversely, a contaminant generated due to a dielectric breakdown in the feeding space 8 does not enter the discharge space 3 through the gas relay region R7.

The active gas generator 100 according to Embodiment 1 has the gas separation structure for separating a gas stream into the feeding space 8 and the active gas generating space including the discharge space 3, using the peripheral stepped region 79 of the housing 7 and the high-voltage-electrode dielectric film 1.

The active gas generator 100 according to Embodiment 1 has the gas separation structure for separating a gas stream into the active gas generating space including the discharge space 3 and the feeding space 8.

In addition, the active gas generator 100 sets the feeding space 8 under vacuum using the vacuum pump 15, so that the feeding space 8 exhibits relatively high insulating properties.

Here, the pressure difference between the feeding space 8 and the discharge space 3 is as high as a pressure in the discharge space 3. Since reducing the pressure in the discharge space 3 can keep lower the differential-pressure applied force exerted on the high-voltage-electrode dielectric film 1 that is the first electrode dielectric film, the high-voltage-electrode dielectric film 1 need not be thicker more than necessary.

Since the active gas generator 100 can reliably avoid a phenomenon in which a discharge voltage decreases as the high-voltage-electrode dielectric film 1 is thicker, the amount of the active gas 61 to be generated never decreases. The following will describe this point in detail.

According to Embodiment 1, the feeding space 8 is set under vacuum so that the pressure in the feeding space 8 is less than 0.01 Pa. The feeding space 8 set under vacuum exhibits insulating properties higher than those when the feeding space 8 is at atmospheric pressure. Specifically, the dielectric strength of the feeding space 8 under vacuum can be 30 kv/mm or higher.

Since the active gas generator 100 has the gas separation structure, the pressure difference between the feeding space 8 and the discharge space 3 is equal to the pressure in the discharge space 3 when the feeding space 8 is set under vacuum.

To give the feeding space 8 in non-vacuum conditions insulating properties as high as those of the feeding space 8 set under vacuum, the feeding space 8 needs to keep the pressure higher than atmospheric pressure, depending on a gas type. For example, it is necessary to set the pressure in the feeding space 8 to approximately ten times atmospheric pressure. Here, the pressure difference between the feeding space 8 and the discharge space 3 relatively increases.

For example, when the pressure in the discharge space 3 is 30 kPa and the feeding space 8 is set to a pressure closer to atmospheric pressure of approximately 100 kPa, a differential-pressure applied force of approximately 70 kPa is applied to the high-voltage-electrode dielectric film 1. Thus, when the pressure in the feeding space 8 is set higher than or equal to atmospheric pressure, a differential-pressure applied force of approximately 70 kPa or higher is applied to the high-voltage-electrode dielectric film 1.

When the pressure in the discharge space 3 is set as low as 30 kPa and the feeding space 8 is set under vacuum, a differential-pressure applied force exerted on the high-voltage-electrode dielectric film 1 can be kept at approximately 30 kPa.

In the case where the pressure in the discharge space 3 is set at near atmospheric pressure or lower than atmospheric pressure, the differential-pressure applied force exerted on the high-voltage-electrode dielectric film 1 when the feeding space 8 is set under vacuum is smaller than that when the feeding space 8 is set to a high voltage.

For preventing the high-voltage-electrode dielectric film 1 from being damaged, the high-voltage-electrode dielectric film 1 needs to be thicker. However, since thickening the high-voltage-electrode dielectric film 1 under a constant discharge application voltage reduces the discharge power to be consumed, that is, the energy for generating the active gas, the disadvantage is reduction in the amount of the active gas 61 to be generated.

In contrast, increasing the discharge application voltage can proportionately increase the discharge power, and increase the amount of the active gas 61 to be generated. However, when the feeding space 8 is set in non-vacuum conditions (a pressure higher than or equal to atmospheric pressure is applied), the insulating properties of the feeding space 8 needs to be enhanced according to increase in the discharge application voltage.

This further requires increase in the pressure in the feeding space 8. This increase in the pressure requires thickening the high-voltage-electrode dielectric film 1, and consequently brings a disadvantage of reduction in the amount of the active gas 61 to be generated.

Thus, enhancing the insulating properties of the feeding space 8 is extremely difficult, in a method for increasing the pressure in the feeding space 8 without reducing the amount of the active gas 61 to be generated.

Since the active gas generator 100 according to Embodiment 1 can achieve the high insulating properties in the feeding space 8 set under vacuum, the active gas generator 100 can apply a relatively high discharge application voltage to increase the amount of the active gas 61 to be generated.

In such a case, the differential-pressure applied force exerted on the high-voltage-electrode dielectric film 1 does not increase. Thus, there is no disadvantage of thickening the high-voltage-electrode dielectric film 1 and reducing the amount of the active gas 61 to be generated.

Consequently, the active gas generator 100 according to Embodiment 1 can produce an advantage of enhancing the insulating properties in the feeding space 8 without reducing the amount of the active gas 61 to be generated.

Figure 2:
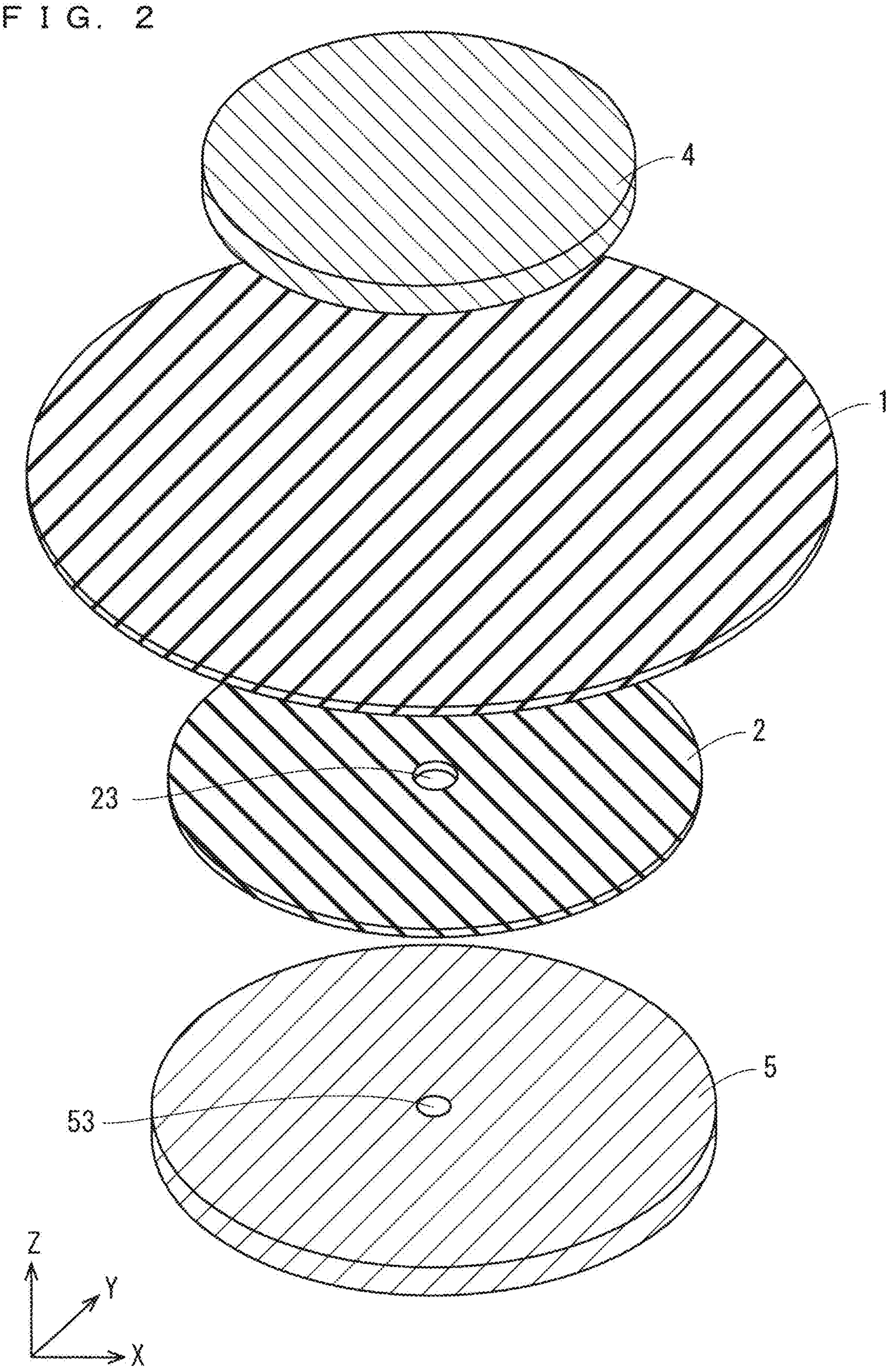
FIG. 2 illustrates a perspective view of a whole structure of a high-voltage-electrode dielectric film, a high voltage feeder, a ground-electrode dielectric film, and a ground feeder that are illustrated in FIG. 1.

FIG. 2 illustrates a perspective view of a whole structure of the high-voltage-electrode dielectric film 1, the high voltage feeder 4, the ground-electrode dielectric film 2, and the ground feeder 5 that are illustrated in FIG. 1. FIG. 2 illustrates an XYZ rectangular coordinate system.

(High Voltage Application Electrode Part)

As illustrated in FIG. 2, the high voltage feeder 4 and the high-voltage-electrode dielectric film 1 that are included in the high voltage application electrode part are circular in a plan view of an XY plane. The high-voltage-electrode dielectric film 1 includes the high voltage feeder 4 in a plan view, and is wider than the high voltage feeder 4.

As illustrated in FIG. 2, the high voltage feeder 4 is disposed on the high-voltage-electrode dielectric film 1 so that the lower protruding region R4 having an annular shape in a plan view is formed in contact with the upper surface of the high-voltage-electrode dielectric film 1.

(Ground Potential Electrode Part)

As illustrated in FIG. 2, the ground-electrode dielectric film 2 and the ground feeder 5 that are included in the ground potential electrode part are circular in a plan view. The ground-electrode dielectric films 2 is almost as large as the ground feeder 5 in a plan view.

The ground-electrode dielectric film 2 includes, in its center position, the gas outlet 23 for ejecting the active gas 61 generated in the discharge space 3 downward. The gas outlet 23 is formed through the ground-electrode dielectric film 2.

The ground feeder 5 includes, in its center position, the gas outlet 53 (feeder gas outlet) for ejecting the active gas 61 from the gas outlet 23 downward. The gas outlet 53 is formed through the ground feeder 5.

As illustrated in FIG. 1, the ground-electrode dielectric film 2 is formed on the ground feeder 5 so that the center of the gas outlet 23 coincides with the center of the gas outlet 53. The gas outlet 53 of the ground feeder 5 is as large as or slightly narrower than the gas outlet 23 of the ground-electrode dielectric film 2.

Only the lower protruding region R4 of the high voltage feeder 4 is in contact with the high-voltage-electrode dielectric film 1. The ground feeder 5 is disposed to cover the entirety of the lower protruding region R4 in a plan view. Thus, the discharge space 3 is substantially defined by a formed region of the lower protruding region R4 of the high voltage feeder 4. Accordingly, the discharge space 3 is annularly formed with respect to the gas outlet 23 in a plan view of the XY plane.

(Housing 7)

Figure 3:
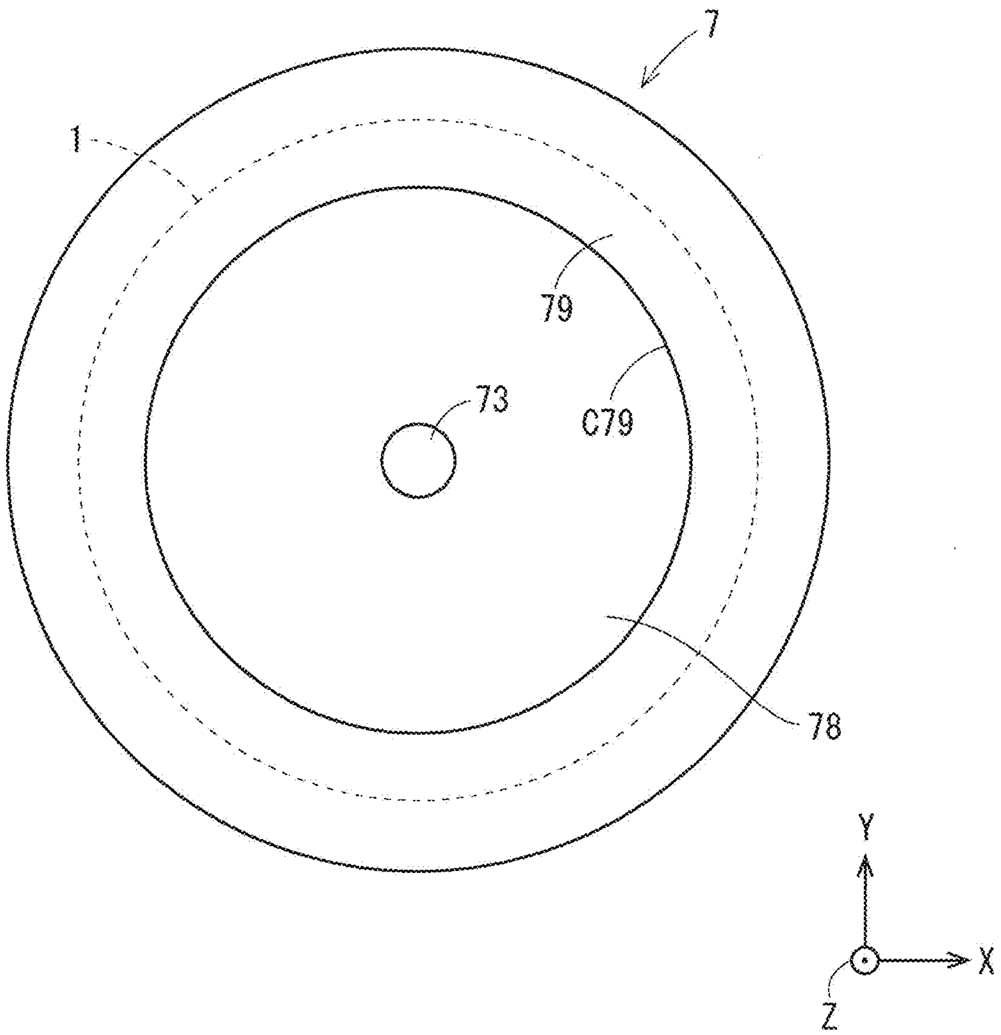
FIG. 3 illustrates a plan view of a planar structure of a housing in FIG. 1.

FIG. 3 illustrates a plan view of a planar structure of the housing 7 in FIG. 1. FIG. 3 illustrates an XYZ rectangular coordinate system.

Ground potential is given to the housing 7 made of a metal and having conductivity. As illustrated in FIG. 3, the housing 7 is circular in a plan view, and includes the central bottom region 78 and the peripheral stepped region 79.

As illustrated in FIG. 3, the central bottom region 78 is circularly formed in a plan view. The peripheral stepped region 79 has an inner periphery C79 along the outer periphery of the central bottom region 78, and is annularly formed in a plan view.

As illustrated in FIG. 1, the housing 7 has a depressed structure in a cross-sectional view, and includes the central bottom region 78 and the peripheral stepped region 79 in this order from the center to the periphery of the housing 7. The upper surface of the peripheral stepped region 79 is set higher in formed height than the central bottom region 78.

The housing 7 includes the gas outlet 73 (housing gas outlet) in a center position of the central bottom region 78. The gas outlet 73 passes through the central bottom region 78 of the housing 7.

The gas outlet 73 of the housing 7 corresponds to the gas outlet 23 and the gas outlet 53, and is formed in a position coinciding with the gas outlet 23 in a plan view. That is to say, the gas outlet 73 is formed immediately below the gas outlet 23.

As illustrated in FIGS. 1 and 3, the high-voltage-electrode dielectric film 1 is formed on the peripheral stepped region 79. The high-voltage-electrode dielectric film 1 is set sufficiently longer in diameter than the inner periphery C79 of the peripheral stepped region 79. Furthermore, the high-voltage-electrode dielectric film 1 is disposed on the peripheral stepped region 79 through, for example, an O-ring for sealing the lower surface of the high-voltage-electrode dielectric film 1 and the upper surface of the peripheral stepped region 79.

Thus, the high-voltage-electrode dielectric film 1 on the peripheral stepped region 79 can completely separate the active gas generating space under the high-voltage-electrode dielectric film 1 from the feeding space 8 above the high-voltage-electrode dielectric film 1.

As such, the active gas generator 100 according to Embodiment 1 has the gas separation structure for separating a gas stream to the feeding space 8 and the active gas generating space, using the peripheral stepped region 79 and the high-voltage-electrode dielectric film 1.

In the active gas generator 100 with such a structure, the material gas 60 supplied from the material gas inlet 70 to the housing 7 is injected from the outer periphery 360 degrees toward the discharge space 3 that is toroidal in a plan view, through the gas relay region R7 and the outer peripheral dielectric space 13.

Then, application of the discharge power to the discharge space 3 causes the dielectric barrier discharge in the discharge space 3. Passing of the material gas 60 through the discharge space 3 generates the active gas 61.

The active gas 61 is ejected to the processing space 30 outside through the central dielectric space 14 and the gas outlets 23, 53, and 73.

As described above, the high-voltage-electrode dielectric film 1 is disposed on the peripheral stepped region 79, and the ground-electrode dielectric film 2 is formed above the central bottom region 78.

Since the ground feeder 5 that is the second feeder is disposed on the central bottom region 78 in the active gas generator 100 according to Embodiment 1, the formed height of the central bottom region 78 enables the first positioning for determining the formed height of the lower surface of the ground feeder 5.

In contrast, since the high-voltage-electrode dielectric film 1 that is the first electrode dielectric film is disposed on the peripheral stepped region 79, the formed height of the peripheral stepped region 79 enables the second positioning for determining the formed height of the lower surface of the high-voltage-electrode dielectric film 1.

The first positioning and the second positioning can be independently performed. Thus, adjusting at least one of the thickness of the ground feeder 5 and the thickness of the ground-electrode dielectric film 2 can set, with high precision, a difference of elevation between the lower surface of the high-voltage-electrode dielectric film 1 and the upper surface of the ground-electrode dielectric film 2, that is, a gap length of the discharge space 3.

Furthermore, the combination of the peripheral stepped region 79 of the housing 7 and the high-voltage-electrode dielectric film 1 provides the gas separation structure for separating a gas stream into the feeding space 8 and the active gas generating space. Thus, the active gas generator 100 with the gas separation structure of a relatively simple structure can be obtained without using dedicated parts for separation between the feeding space 8 and the active gas generating space.

Embodiment 2

(Principle)

In the active gas generator 100 according to Embodiment 1, most of the ground-electrode dielectric film 2 is thermally in contact with the housing 7 through the ground feeder 5, whereas a region of the high-voltage-electrode dielectric film 1 in contact with the housing 7 is limited to a part of the peripheral stepped region 79.

Furthermore, since the feeding space 8 is set under vacuum using the vacuum pump 15, the feeding space 8 is thermally insulated from the high-voltage-electrode dielectric film 1. Thus, the amount of heat generated by the dielectric barrier discharge in the discharge space 3 and removed for the high-voltage-electrode dielectric film 1 is less. Thereby, the high-voltage-electrode dielectric film 1 may be damaged from a thermal expansion through heating.

In Embodiment 2, a high voltage feeder 4B has a cooling function to protect the high-voltage-electrode dielectric film 1 from the thermal expansion through heating.

(Whole Structure)

Figure 4:
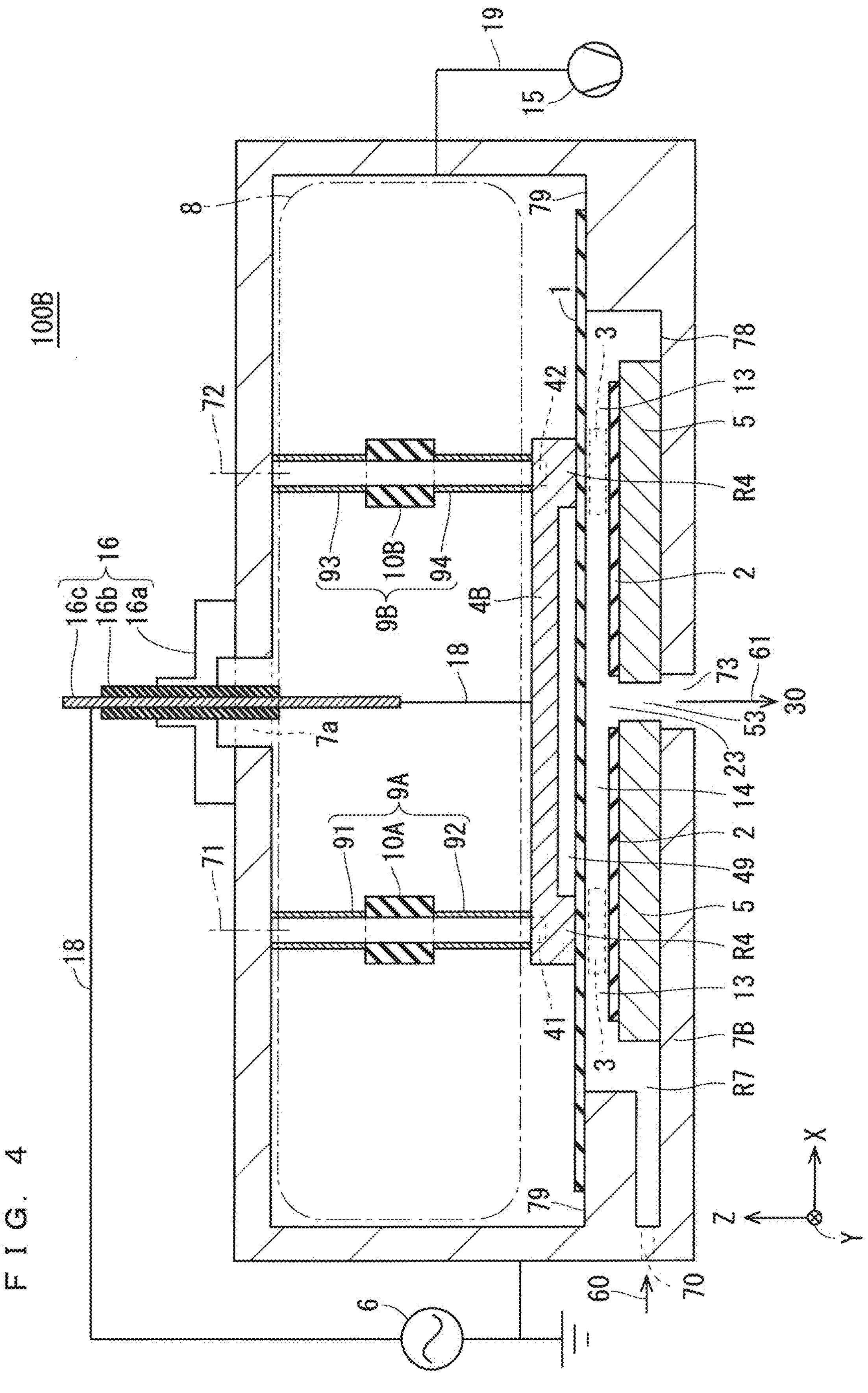
FIG. 4 illustrates a whole structure of an active gas generator according to Embodiment 2.

FIG. 4 illustrates a whole structure of an active gas generator according to Embodiment 2 of the present disclosure. FIG. 4 illustrates an XYZ rectangular coordinate system.

An active gas generator 100B according to Embodiment 2 includes, as main constituent elements, the high-voltage-electrode dielectric film 1, the ground-electrode dielectric film 2, the high voltage feeder 4B, the ground feeder 5, the high-voltage AC power supply 6, a housing 7B, cooling pipes 9A and 9B, the vacuum pump 15, and the current lead terminal 16.

The active gas generator 100B according to Embodiment 2 is characterized by replacing the high voltage feeder 4 with the high voltage feeder 4B and the housing 7 with the housing 7B, and newly adding the cooling pipes 9A and 9B as compared to the active gas generator 100. Since the other constituent elements of the active gas generator 100B are the same as those in the active gas generator 100, the same reference numerals will be assigned to the same constituent elements and the description thereof will be appropriately omitted.

A high voltage application electrode part includes the high-voltage-electrode dielectric film 1 that is the first electrode dielectric film, and the high voltage feeder 4B that is the first feeder. The ground potential electrode part includes the ground-electrode dielectric film 2 that is the second electrode dielectric film, and the ground feeder 5 that is the second feeder. The ground-electrode dielectric film 2 is formed below the high-voltage-electrode dielectric film 1.

The housing 7B is made of a metal having conductivity, and accommodates the high-voltage-electrode dielectric film 1, the ground-electrode dielectric film 2, the high voltage feeder 4B, and the ground feeder 5. The housing 7B includes the feeding space 8 above the high voltage feeder 4B.

The high-voltage AC power supply 6 applies an AC voltage between the high voltage feeder 4B and the ground feeder 5. Specifically, the high-voltage AC power supply 6 applies the AC voltage to the high voltage feeder 4B, and the ground feeder 5 is set to ground potential through the housing 7B.

The high-voltage AC power supply 6 is electrically connected to the upper end of the electrode 16*c* of the current lead terminal 16 with the same structure as that of Embodiment 1, through the electrical wire 18. The lower end of the electrode 16*c* is electrically connected to the high voltage feeder 4B through the electrical wire 18.

Accordingly, the high-voltage AC power supply 6 applies the AC voltage to the high voltage feeder 4B through the electrode 16*c* of the current lead terminal 16. This AC voltage is used as the discharge application voltage. Specifically, the discharge application voltage is a potential difference between the high voltage feeder 4B and the ground feeder 5.

The feeding space 8 is a space including the electrode 16*c* and the electrical wire 18 in the housing 7B above the high voltage feeder 4B. The feeding space 8 is an internal space within the housing 7B for supplying the discharge application voltage to the high voltage feeder 4B.

The housing 7B includes, on its upper surface, a cooling medium inlet 71 receiving a cooling medium from the outside, and a cooling medium outlet 72 emitting the cooling medium to the outside. The cooling medium inlet 71 and the cooling medium outlet 72 are formed through the upper surface of the housing 7B. FIG. 4 schematically illustrates the cooling medium inlet 71 and the cooling medium outlet 72 using alternate long and short dashed lines. Conceivable examples of the cooling medium include gas such as coolant gas and liquid such as oil.

Since the housing 7B has the same features as those of the housing 7 according to Embodiment 1 except for including the cooling medium inlet 71 and the cooling medium outlet 72, the description of the features of the housing 7B identical to those of the housing 7 will be appropriately omitted.

The high voltage feeder 4B that is the first feeder differs from the high voltage feeder 4 according to Embodiment 1 by including a cooling path structure 40.

The cooling path structure 40 includes, on its upper surface, a cooling medium input port 41 and a cooling medium output port 42, and a cooling medium path 45 inside. The cooling medium path 45 is a path for allowing a cooling medium supplied through the cooling medium input port 41 to flow inside and outputting the cooling medium from the cooling medium output port 42.

The cooling medium inlet 71 of the housing 7B and the cooling medium input port 41 of the high voltage feeder 4B are disposed in overlapping positions in a plan view of a XY plane. Similarly, the cooling medium outlet 72 of the housing 7B and the cooling medium output port 42 of the high voltage feeder 4B are disposed in overlapping positions in a plan view.

The cooling pipe 9A is disposed between the cooling medium inlet 71 and the cooling medium input port 41. The cooling pipe 9A includes partial cooling pipes 91 and 92, and an insulated joint 10A. One end of the partial cooling pipe 91 is connected to the cooling medium inlet 71, and the other end is connected to one end of the insulated joint 10A. The other end of the insulated joint 10A is connected to one end of the partial cooling pipe 92, and the other end of the partial cooling pipe 92 is connected to the cooling medium input port 41.

Thus, the cooling medium can be supplied from the cooling medium inlet 71 to the cooling medium input port 41 through the partial cooling pipe 91, the insulated joint 10A, and the partial cooling pipe 92.

The cooling pipe 9B is disposed between the cooling medium outlet 72 and the cooling medium output port 42. The cooling pipe 9B includes partial cooling pipes 93 and 94, and an insulated joint 10B. One end of the partial cooling pipe 93 is connected to the cooling medium outlet 72, and the other end is connected to one end of the insulated joint 10B. The other end of the insulated joint 10B is connected to one end of the partial cooling pipe 94, and the other end of the partial cooling pipe 94 is connected to the cooling medium output port 42.

Thus, the cooling medium can be emitted from the cooling medium output port 42 to the cooling medium outlet 72 through the partial cooling pipe 94, the insulated joint 10B, and the partial cooling pipe 93.

Each of the partial cooling pipes 91 to 94 has conductivity. The cooling pipes 9A and 9B are first and second cooling pipes, the partial cooling pipes 91 and 92 are a first pair of partial cooling pipes, and the partial cooling pipes 93 and 94 are a second pair of partial cooling pipes. The insulated joints 10A and 10B are first and second insulated joints.

The dielectric space where the high-voltage-electrode dielectric film 1 faces the ground-electrode dielectric film 2 includes the discharge space 3 including a region where the lower protruding region R4 of the high voltage feeder 4B overlaps the ground feeder 5 in a plan view.

Similarly to Embodiment 1, the active gas generator 100B according to Embodiment 2 includes the attachment feature of independently providing the high voltage application electrode part (the high-voltage-electrode dielectric film 1+the high voltage feeder 4B) and the ground potential electrode part (the ground-electrode dielectric film 2+the ground feeder 5).

Similarly to Embodiment 1, the active gas generator 100B according to Embodiment 2 has the gas separation structure for separating a gas stream into the feeding space 8 and the active gas generating space including the discharge space 3, using the combination of the peripheral stepped region 79 of the housing 7B and the high-voltage-electrode dielectric film 1.

Consequently, the active gas generator 100B according to Embodiment 2 can produce an advantage of enhancing the insulating properties in the feeding space 8 without reducing the amount of the active gas 61 to be generated, similarly to Embodiment 1.

Figure 5:
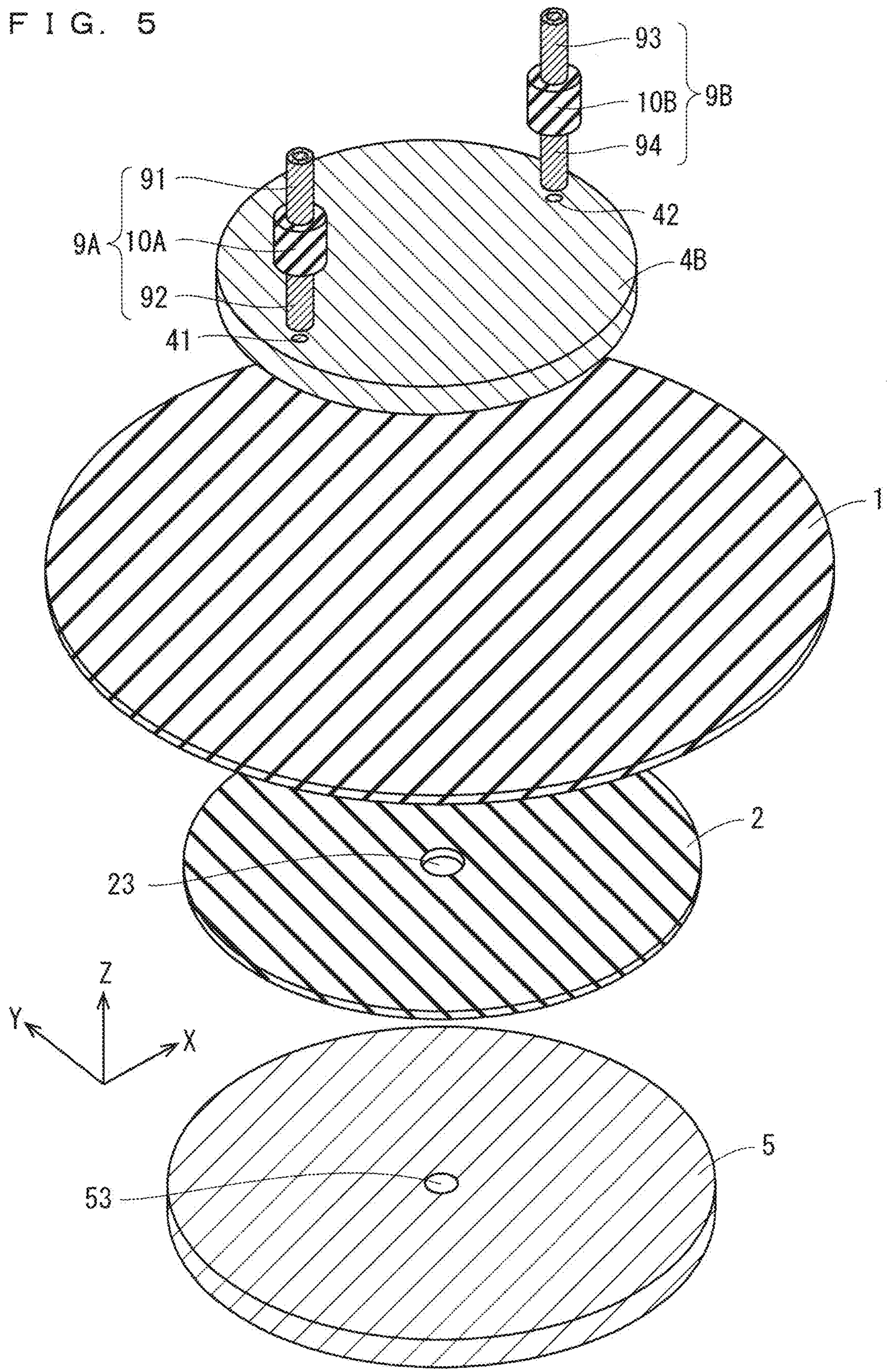
FIG. 5 illustrates a perspective view of a whole structure of a high-voltage-electrode dielectric film, a high voltage feeder, a ground-electrode dielectric film, a ground feeder, and cooling pipes that are illustrated in FIG. 4.

FIG. 5 illustrates a perspective view of a whole structure of the high-voltage-electrode dielectric film 1, the high voltage feeder 4B, the ground-electrode dielectric film 2, the ground feeder 5, and the cooling pipes 9A and 9B that are illustrated in FIG. 4. FIG. 5 illustrates an XYZ rectangular coordinate system.

(High Voltage Application Electrode Part)

As illustrated in FIG. 5, the high voltage feeder 4B and the high-voltage-electrode dielectric film 1 that are included in the high voltage application electrode part are circular in a plan view of an XY plane. The high-voltage-electrode dielectric film 1 includes the high voltage feeder 4B in a plan view, and is wider than the high voltage feeder 4B.

As illustrated in FIG. 4, the high voltage feeder 4 is disposed on the high-voltage-electrode dielectric film 1 so that only the lower protruding region R4 is in contact with the upper surface of the high-voltage-electrode dielectric film 1.

(Ground Potential Electrode Part)

As illustrated in FIG. 5, the ground-electrode dielectric film 2 and the ground feeder 5 that are included in the ground potential electrode part have the same shapes and are disposed in the same positions as those according to Embodiment 1.

Only the lower protruding region R4 of the high voltage feeder 4B is in contact with the high-voltage-electrode dielectric film 1. The ground feeder 5 is disposed to cover the lower protruding region R4 in a plan view. Thus, the discharge space 3 is substantially defined by a formed region of the lower protruding region R4 of the high voltage feeder 4B. Accordingly, the discharge space 3 is annularly formed with respect to the gas outlet 23 in a plan view.

(Cooling Pipes 9A and 9B)

As illustrated in FIGS. 4 and 5, the cooling pipe 9A is disposed on the cooling medium input port 41 of the high voltage feeder 4B, and the cooling pipe 9B is disposed on the cooling medium output port 42.

(Cooling Path Structure 40)

Figure 6:
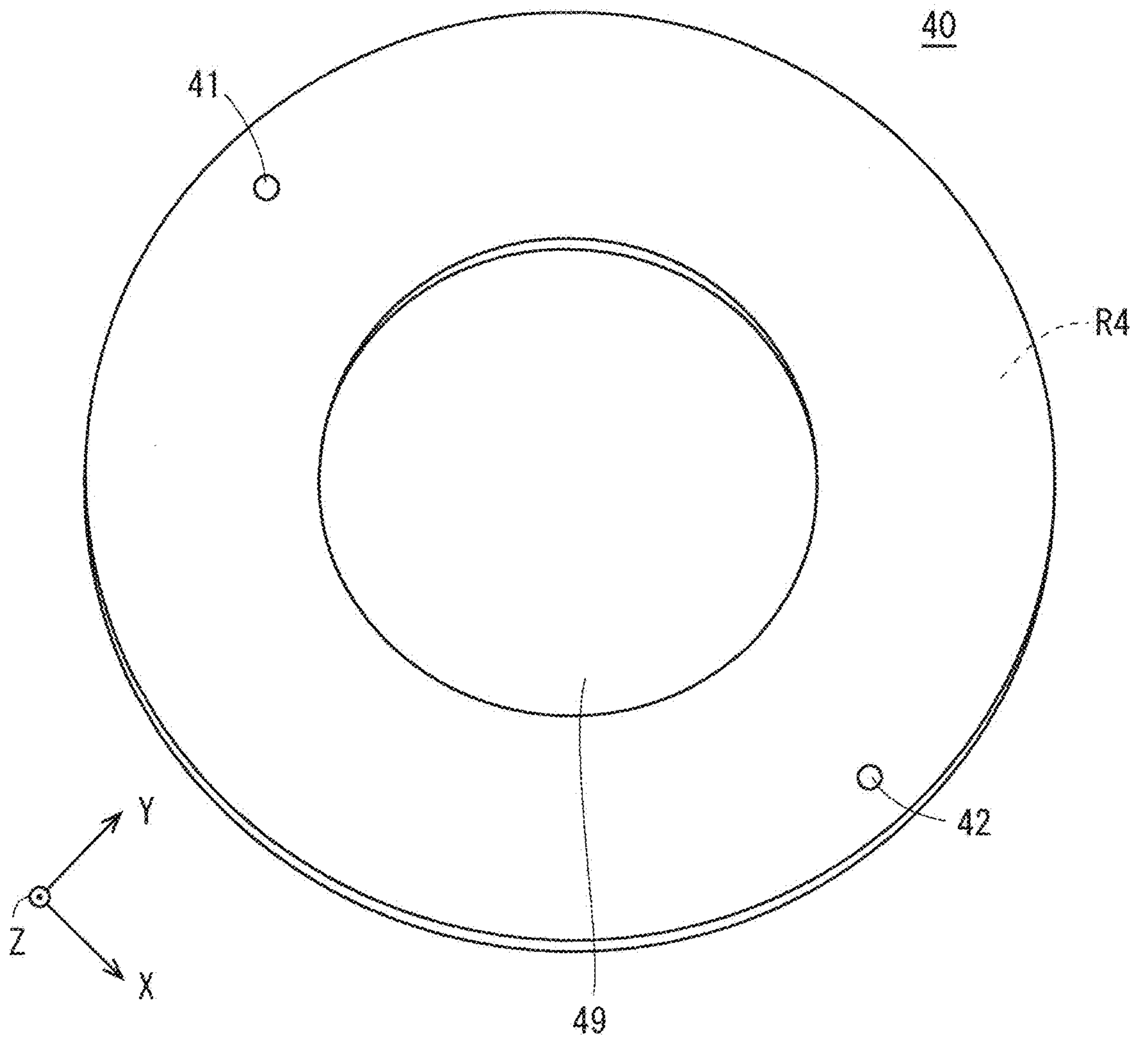
FIG. 6 illustrates a (first) structure of a cooling path structure included in the high voltage feeder in FIG. 4.
Figure 7:
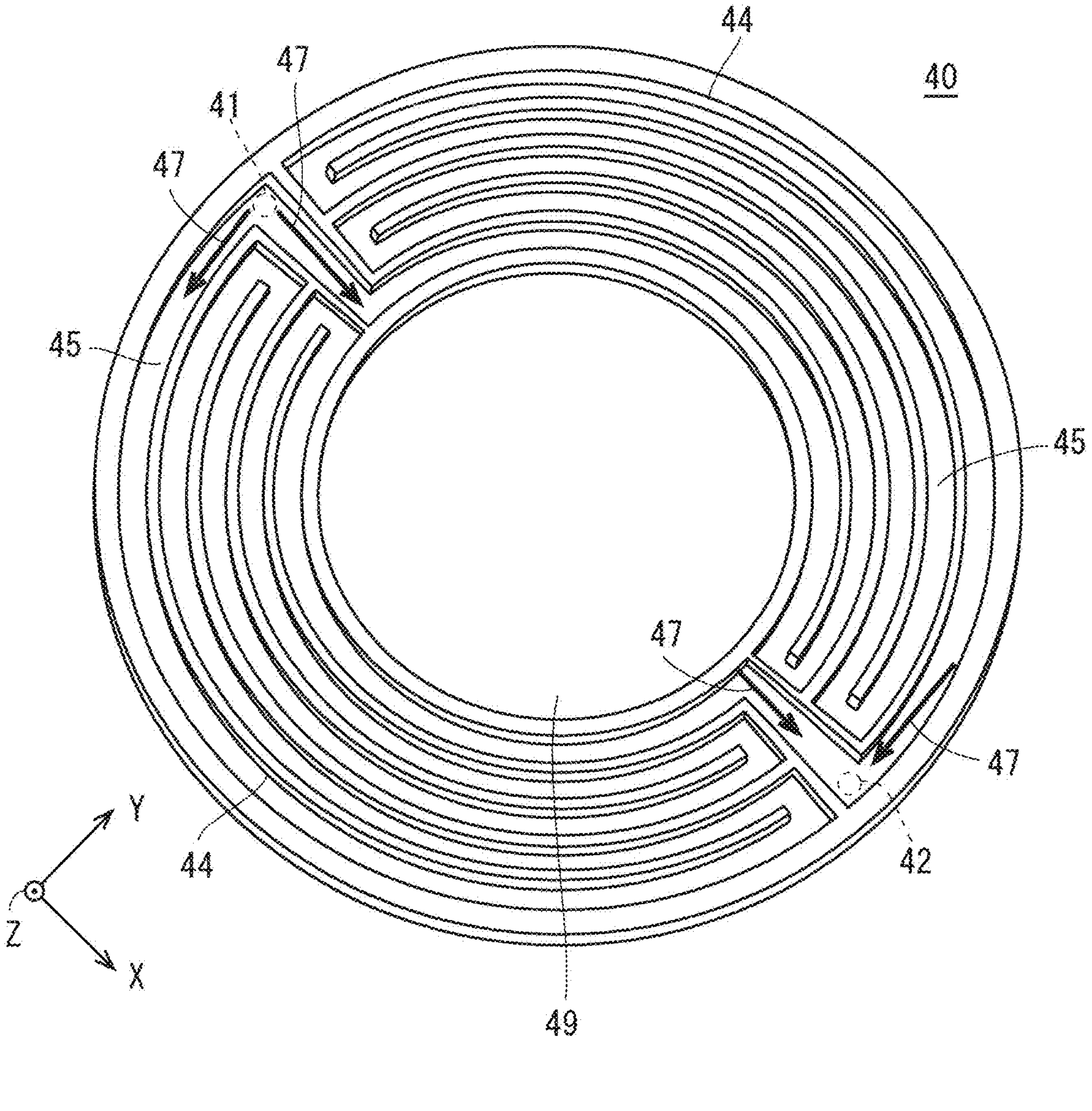
FIG. 7 illustrates a (second) structure of the cooling path structure included in the high voltage feeder.

FIGS. 6 and 7 illustrate a structure of the cooling path structure 40 included in the high voltage feeder 4B. FIG. 6 illustrates an upper surface structure of the cooling path structure 40, and FIG. 7 illustrates an internal structure of the cooling path structure 40.

As illustrated in FIGS. 6 and 7, the cooling path structure 40 is included in the lower protruding region R4 except for a central region of the high voltage feeder 4B. The central region of the high voltage feeder 4B is a region below which the lower space 49 exists.

The cooling path structure 40 includes, as main constituent elements, the cooling medium input port 41, the cooling medium output port 42, a plurality of side walls 44, and the cooling medium path 45.

The cooling medium input port 41 and the cooling medium output port 42 are formed on the upper surface of the cooling path structure 40 without passing through the high voltage feeder 4B. The cooling medium input port 41 and the cooling medium output port 42 are connected to the cooling medium path 45.

The cooling medium path 45 is formed to create flows 47 of a cooling medium in a circumferential direction along the plurality of side walls 44. In the cooling medium path 45, the plurality of side walls 44 formed from the inner periphery to the outer periphery divide the flows 47 of the cooling medium into two. Thus, the cooling medium entering the cooling medium input port 41 is divided into a first flow from the outer periphery to the inner periphery and a second flow from the inner periphery to the outer periphery along the flows 47 of the cooling medium. These first and second flows finally merge in the cooling medium output port 42.

As such, the high voltage feeder 4B includes the cooling path structure 40 including the cooling medium path 45 through which the cooling medium flows.

As illustrated in FIGS. 6 and 7, the high voltage feeder 4B includes the cooling path structure 40 including the cooling medium path 45. The cooling medium path 45 is a region through which the cooling medium entering the cooling medium input port 41 passes. The cooling medium flowing through the cooling medium path 45 is emitted from the cooling medium output port 42 to the outside of the cooling path structure 40.

The cooling medium input port 41 is disposed in a position allowing the cooling medium supplied from the cooling medium inlet 71 of the housing 7B through the cooling pipe 9A to flow. Furthermore, the cooling medium output port 42 is disposed in a position allowing the cooling medium emitted from the cooling medium path 45 to be emitted to the cooling medium outlet 72 of the housing 7B through the cooling pipe 9B.

As illustrated in FIGS. 6 and 7, the cooling path structure 40 is formed in a region corresponding to the lower protruding region R4 in a plan view. Then, the cooling medium path 45 is formed almost in the entirety of the cooling path structure 40.

Thus, the high voltage feeder 4B has the cooling function of cooling the high-voltage-electrode dielectric film 1 through the cooling medium path 45 through which the cooling medium flows, with the lower protruding region R4 being in contact with the upper surface of the high-voltage-electrode dielectric film 1.

In the active gas generator 100B with such a structure, the material gas 60 supplied from the material gas inlet 70 to the housing 7B is injected from the outer periphery 360 degrees toward the discharge space 3 that is toroidal in a plan view, through the gas relay region R7 and the outer peripheral dielectric space 13.

Then, application of the discharge power to the discharge space 3 causes the dielectric barrier discharge in the discharge space 3. Passing of the material gas 60 through the discharge space 3 generates the active gas 61.

The active gas 61 is ejected to the processing space 30 outside through the central dielectric space 14 and the gas outlets 23, 53, and 73.

As described above, the high voltage feeder 4B that is the first feeder of the active gas generator 100B according to Embodiment 2 has the cooling function using the cooling medium path 45 through which the cooling medium flows. Thus, the high voltage feeder 4B can cool the high-voltage-electrode dielectric film 1 which is the first electrode dielectric film with the lower surface forming the discharge space 3.

Since this can reduce the heating phenomenon occurring in the high-voltage-electrode dielectric film 1 in the active gas generator 100B according to Embodiment 2, the high-voltage-electrode dielectric film 1 can be protected from the thermal expansion caused by the heating. The following will describe this point in detail.

The dielectric barrier discharge generates heat in a dielectric, due to collision of ions and electrons with high energy generated mainly from the discharge on the surface of the high-voltage-electrode dielectric film 1.

Specifically, the surface of the high-voltage-electrode dielectric film 1 facing the discharge space 3 is a heat source in the active gas generator 100B. According to Embodiment 2, the high voltage feeder 4B with the cooling function can cool the high-voltage-electrode dielectric film 1 in contact with the high voltage feeder 4B.

Consequently, the active gas generator 100B according to Embodiment 2 can effectively prevent excessive heating of the high-voltage-electrode dielectric film 1 by the dielectric barrier discharge in the discharge space 3. Thus, the high-voltage-electrode dielectric film 1 does not have thermal expansion.

Furthermore, the lower surface of the lower protruding region R4 of the high voltage feeder 4B and the upper surface of the high-voltage-electrode dielectric film 1 are not completely plane but slightly rough, and may have high thermal resistance. In such a case, application of a liquid with a low vapor pressure, for example, a fluorinated oil between the lower surface of the lower protruding region R4 and the upper surface of the high-voltage-electrode dielectric film 1 may increase the thermal conductivity.

Since a part of the cooling medium path 45 through which the cooling medium such as gas for cooling flows is a portion to which a high voltage is applied, a cooling medium with conductivity cannot flow through the cooling medium path 45. Thus, the cooling medium (medium) in Embodiment 2 is preferably gas such as air or nitrogen, or high insulating oils.

When a high voltage is applied to the high voltage feeder 4B and both of the cooling pipes 9A and 9B through which a cooling medium flows are made of a metal with conductivity, electrical connection between the housing 7B and the high voltage feeder 4B develops a short circuit.

Here, inserting the insulated joints 10A and 10B made of an insulating material such as ceramic into middle regions of the cooling pipes 9A and 9B, respectively, prevents the dielectric breakdown between the high voltage feeder 4B and the housing 7B.

As such, the cooling pipe 9A that is the first cooling pipe includes the insulated joint 10A that is the first insulated joint, between the partial cooling pipes 91 and 92 that are the first pair of partial cooling pipes. Furthermore, the cooling pipe 9B that is the second cooling pipe includes the insulated joint 10B that is the second insulated joint, between the partial cooling pipes 93 and 94 that are the second pair of partial cooling pipes.

Thus, the active gas generator 100B according to Embodiment 2 can reliably avoid a short-circuit phenomenon caused by an electrical connection between the housing 7B and the high voltage feeder 4B, through the cooling pipe 9A or 9B.

In addition, the partial cooling pipes 91 to 94 made of a metal can be relatively rigidly formed in a desired shape.

Furthermore, the high-voltage-electrode dielectric film 1 is disposed on the peripheral stepped region 79, and the ground-electrode dielectric film 2 is formed above the central bottom region 78 in the active gas generator 100B.

Thus, a gap length of the discharge space 3 can be set with high precision in the active gas generator 100B according to Embodiment 2, similarly to Embodiment 1.

Furthermore, the active gas generator 100B according to Embodiment 2 can have the gas separation structure of a relatively simple structure including the high-voltage-electrode dielectric film 1 and the peripheral stepped region 79 similarly to Embodiment 1.

Although the present disclosure has been described in detail, the foregoing description is in all aspects illustrative, and does not restrict the disclosure. It is therefore understood that numerous modifications can be devised without departing from the scope of the disclosure.

The invention claimed is:

1. An active gas generator that supplies a material gas to a discharge space where a dielectric barrier discharge occurs, to activate the material gas and generate active gas, the active gas generator comprising:

a first electrode dielectric film;

a second electrode dielectric film formed below the first electrode dielectric film;

a first feeder disposed on an upper surface of the first electrode dielectric film, the first feeder having conductivity; and a second feeder disposed on a lower surface of the second electrode dielectric film, wherein an AC voltage is applied to the first feeder, the second feeder is set to ground potential, and a dielectric space in which the first electrode dielectric film faces the second electrode dielectric film includes the discharge space, the second electrode dielectric film includes a gas outlet for ejecting the active gas downward, the active gas generator further comprises a housing having conductivity and accommodating the first and second electrode dielectric films and the first and second feeders, the housing including a feeding space above the first feeder, the housing including:

a material gas inlet receiving the material gas from outside;

a gas relay region for supplying the material gas to the discharge space; and a housing gas outlet for ejecting the active gas from the gas outlet downward, a space from the material gas inlet to the housing gas outlet through the gas relay region and the discharge space is defined as an active gas generating space, the housing and the first electrode dielectric film form a gas separation structure for separating a gas stream into the active gas generating space and the feeding space, and the active gas generator further comprises a vacuum pump disposed outside the housing and setting the feeding space under vacuum.

2. The active gas generator according to claim 1, wherein the housing includes a cooling medium inlet receiving a cooling medium from outside, and a cooling medium outlet emitting the cooling medium to the outside, the first feeder includes:

a cooling medium input port;

a cooling medium output port; and a cooling medium path allowing the cooling medium supplied through the cooling medium input port to flow inside and outputting the cooling medium from the cooling medium output port, the active gas generator further comprising:

a first cooling pipe between the cooling medium inlet and the cooling medium input port; and a second cooling pipe between the cooling medium outlet and the cooling medium output port.

3. The active gas generator according to claim 2, wherein the housing includes:

a central bottom region; and a peripheral stepped region formed along an outer periphery of the central bottom region, the peripheral stepped region being higher in formed height than the central bottom region, the second feeder is disposed on the central bottom region, and application of the ground potential to the housing sets the second feeder to the ground potential through the central bottom region, the first electrode dielectric film is disposed on the peripheral stepped region, and the peripheral stepped region and the first electrode dielectric film form the gas separation structure for separating the gas stream into the feeding space and the active gas generating space.

4. The active gas generator according to claim 2, wherein the first cooling pipe includes:

a first pair of partial cooling pipes each having conductivity; and a first insulated joint between the first pair of partial cooling pipes, the first insulated joint having insulating properties, and the second cooling pipe includes:

a second pair of partial cooling pipes each having conductivity; and a second insulated joint between the second pair of partial cooling pipes, the second insulated joint having insulating properties.

5. The active gas generator according to claim 4, wherein the housing includes:

a central bottom region; and a peripheral stepped region formed along an outer periphery of the central bottom region, the peripheral stepped region being higher in formed height than the central bottom region, the second feeder is disposed on the central bottom region, and application of the ground potential to the housing sets the second feeder to the ground potential through the central bottom region, the first electrode dielectric film is disposed on the peripheral stepped region, and the peripheral stepped region and the first electrode dielectric film form the gas separation structure for separating the gas stream into the feeding space and the active gas generating space.

6. The active gas generator according to claim 1, wherein the housing includes:

a central bottom region; and a peripheral stepped region formed along an outer periphery of the central bottom region, the peripheral stepped region being higher in formed height than the central bottom region, the second feeder is disposed on the central bottom region, and application of the ground potential to the housing sets the second feeder to the ground potential through the central bottom region, the first electrode dielectric film is disposed on the peripheral stepped region, and the peripheral stepped region and the first electrode dielectric film form the gas separation structure for separating the gas stream into the feeding space and the active gas generating space.

* * * * *